(12) United States Patent
Haley et al.

(10) Patent No.: US 6,168,976 B1
(45) Date of Patent: Jan. 2, 2001

(54) SOCKETABLE BGA PACKAGE

(75) Inventors: Kevin J. Haley, San Jose; Larry Moresco, San Carlos, both of CA (US)

(73) Assignee: Intel Corporation, Santa Clara, CA (US)

( * ) Notice: Under 35 U.S.C. 154(b), the term of this patent shall be extended for 0 days.

(21) Appl. No.: 09/226,782

(22) Filed: Jan. 6, 1999

(51) Int. Cl.[7] .................................................. H01L 21/44
(52) U.S. Cl. ......................... 438/118; 438/106; 257/181
(58) Field of Search .............................. 438/17, 618, 123, 438/106, 107, 112, 110, 118, 108, 114, 122; 257/73, 718, 783, 738, 774

(56) References Cited

U.S. PATENT DOCUMENTS

| | | |
|---|---|---|
| 3,676,832 | 7/1972 | Judge et al. . |
| 4,322,119 | 3/1982 | Baker . |
| 4,420,205 | 12/1983 | Kirkman . |
| 4,498,725 | 2/1985 | Bright et al. . |
| 4,773,873 | 9/1988 | Hillis . |
| 4,950,980 | 8/1990 | Pfaff . |
| 5,384,692 | 1/1995 | Jaff . |
| 5,637,008 | 6/1997 | Kozel . |
| 5,669,774 | 9/1997 | Grabbe . |
| 5,691,041 | 11/1997 | Frankeny et al. . |
| 5,707,247 | 1/1998 | Kostad . |
| 5,714,803 | 2/1998 | Queyssac . |
| 5,749,999 | 5/1998 | Dandia . |
| 5,766,021 | 6/1998 | Pickles et al. . |
| 5,783,461 | 7/1998 | Hembree . |
| 5,805,419 | 9/1998 | Hundt et al. . |
| 5,808,474 | 9/1998 | Hively et al. . |
| 5,812,378 | 9/1998 | Fjelstad et al. . |

OTHER PUBLICATIONS

AMP, Single Lever (SL) ZIF Sockets for Intel Pentium™ Processors; Issued 3–94; 2 pages.

*Primary Examiner*—Matthew Smith
*Assistant Examiner*—Calvin Lee
(74) *Attorney, Agent, or Firm*—Blakely, Sokoloff, Taylor & Zafman LLP

(57) ABSTRACT

Socketable balls are mounted to a BGA package by first placing the balls into pockets or holes of a tray that are sized such that when the balls are inserted, an upper portion of the ball protrudes above a planar surface of the tray. A layer of a polymer material is then applied over the balls and a top area of each of the balls is exposed, and plated with solder. During the plating step the polymer provides a solder-tight seal against each of the balls such that, except for the top area, the rest of the surface area of the balls remains solder-free. The solder-plated top area of each of the balls is then bonded to the corresponding plurality of lands of the package by reflowing the solder to establish electrical contact therebetween.

27 Claims, 5 Drawing Sheets

SOCKETABLE BGA PACKAGE

FIELD OF THE INVENTION

The present invention relates generally to the field of electrical connectors; more particularly, to methods and apparatus for establishing a reliable electrical connection to an integrated circuit package.

BACKGROUND OF THE INVENTION

Modern microprocessor-based computer systems are commonly upgradable to improve performance and data processing capability. These computers include integrated circuits (ICs) that are mounted onto printed circuit boards (PCBs) by way of sockets to facilitate removal and installation of newer, higher-performing and more capable devices.

Conventional sockets have typically included connectors that apply a torsional force on the leads or pins of the integrated circuit package to establish electrical contact therebetween. An example of such a socket is found in U.S. Pat. No. 4,498,725. Other types of conventional sockets for use in mounting microprocessor and/or other board-mounted components, such as cache memories, to a PCB are described in U.S. Pat. Nos. 5,707,247; 4,950,980; 4,420,205 and 5,384,692.

A popular way of packaging microprocessors which is particularly well suited for establishing electrical connecting with a testing apparatus such a burn-in board is the ball grid array (BGA) package. As is well known, the manufacture of a BGA package involves attaching leadless solder balls to terminal pads (also referred to as land grid plates) that are arranged in a dense grid pad on one side of the package. A solder reflow process is employed to establish permanent electrical and mechanical connection between the solder balls and the terminal pads. Once made in this manner, the BGA package may be placed into a socket which cooperates with the ball contacts to allow the PCB to be mated/unmated with the package substrate over many cycles. Alternatively, the BGA component may be permanently soldered to plated lands on the PCB.

By way of example, U.S. Pat. Nos. 5,714,803 and 5,783,461 describe traditional ball grid array packages. Various types of sockets for establishing removable connections to solder balls of the BGA package are disclosed in U.S. Pat. Nos. 5,808,474; 5,812,378; 5,766,021; 5,805,419; 5,637,008; and 5,669,774.

One of the problems associated with traditional BGA packages is oxidation of the solder that coats the surface of the balls; this makes the solder ball unreliable as a separable contact surface. To overcome the insulating properties of the surface oxide layer, and thereby establish electrical contact for a socketable connection to the solder ball, past approaches have relied upon application of an extremely high pressure connections. In other words, a typical prior art approach is to forcibly press the solder balls down into the socket—almost to the point of deforming the shape of the solder ball itself. Such high pressure is necessary to break down the native oxide that exists on the outer surface of the solder ball, and also to ensure that the solder can not re-oxidize again once electrical contact has been established.

Another solution to combat the problem of surface oxidation of the solder balls utilizes palladium dendrites, which are plated onto copper vias that pass through a dielectric body of an interposer plate. The interposer plate provides electrical connection between the BGA package and plated lands of a circuit board. This technique is described in U.S. Pat. No. 5,691,041, which teaches that the dendrites penetrate the solder ball oxide layer to create a semi-permanent electrical connection. One of the drawbacks of this approach, however, is that with repeated connection cycles, the dendrites can become damaged thereby degrading the reliability of the connection.

The aforementioned problems have relegated socketable ball grid array packages to burn-in or test applications where contact is established only for the duration of the test. A socketable ball grade array package useful in a removable electrical connection that demands long-term reliability remains an elusive goal. Hence, there still is an unfulfilled need for a production socket that can make reliable contact to standard solder balls of a BGA package.

SUMMARY OF THE INVENTION

The present invention provides a socketable BGA package and a method for producing the same. According to one embodiment of the invented method, a plurality of socketable members are first placed into pockets or holes of a tray. For example, the socketable members may comprise copper balls plated with nickel and gold. The pockets or holes are sized such that when the members are inserted, an upper portion of the socketable member protrudes above a planar surface of the tray. The holes or pockets are arranged in a pattern that corresponds to an array of pads (i.e., lands) disposed on the package.

Next, a layer of material is applied over the socketable members and the planar surface of the tray. This layer of material provides a seal against the upper portion of each socketable member. A top area of the upper portion of each of the socketable members is exposed, and then plated with solder. During this latter step the layer of material acts as a barrier or dam that prevents the solder from being plated to any portion of the socketable member except the exposed top area.

Finally, the solder-plated top area of each of the members is bonded to the corresponding plurality of pads of the package. One way that this bonding step may be accomplished is by reflowing the solder to establish electrical contact between the top area of the member and the corresponding pad. Once again, the layer of material confines the solder to the top area thereby insuring a solder-free electrical contact area of the member.

BRIEF DESCRIPTION OF THE DRAWINGS

The present invention is illustrated by way of example, and not limitation, in the FIGS. of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention.

Figure 1A:
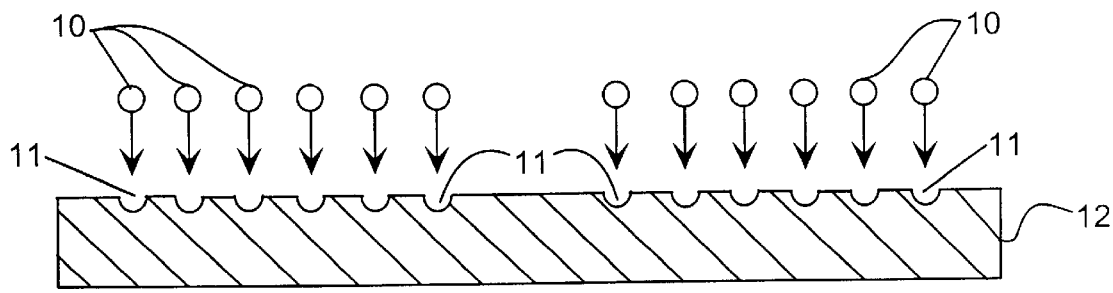
FIGS. 1A–1H illustrate one embodiment of the method of the present invention.

Referring to FIGS. 1A–1H there is shown one embodiment of the method according to the present invention. Socket balls 10 are first arranged in the proper area array grid of a tooled plate or tray 12. In the example of FIG. 1A, the socket balls are placed into pockets or recesses 11 arranged along a top, planar surface of tray 12. In the described embodiment, multiple area array patterns are arranged on tray 12 to enable more economically efficient manufacturing. Of course, the use of multiple area array patterns is not a requirement for practicing the present invention. That is to say, a single array pattern corresponding to the pads of a single BGA package is sufficient.

In the embodiment of FIG. 1A, each of the balls 10 comprises a copper ball coated with nickel and gold. The balls themselves may vary in size, but a typical diameter of the ball is in the range of 20 to 30 millimeters. Such plated copper balls are readily available in the electronic industry; for example, Alpha Metals, Inc., is a company that sells a variety of metallic balls for use in ball grid array packages.

It should be noted that even though the example of FIG. 1A shows the use of pockets or recesses 11 formed in a tray 12, another alternative is to simply provide holes that penetrate through tray 12, and which are sized to accept each of the balls 10. Sizing of the holes should be such as to locate an upper portion of each of the balls above the planar surface of tray 12.

Figure 1B:
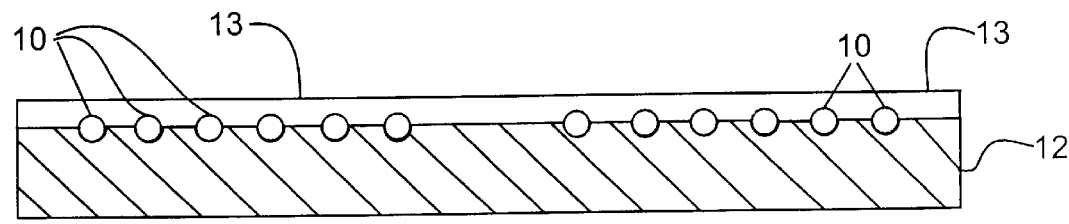

FIG. 1B is a cross-sectional side view illustrating balls 10 after they have been placed into the recesses 11 of tray 12. Note that a bottom portion of each ball rests in one of the recesses, with an upper portion of the ball protruding above the planar surface of tray 12. The purpose of tray 12 is to positions the balls 10 in a desired array configuration—setting the relative location, pitch, alignment, etc., of the balls to match the corresponding array pattern of the pads on the BGA package. In other words, each of the array patterns of tray 12 matches the corresponding land grid array of the package.

Once the balls have been placed into the recesses or holes of tray 12, a layer of material 13 is applied over the top of the balls. In one embodiment, a "still-soft" polymer sheet is pressed down onto the balls so as to conform over the spherical upper surface of the balls. The still-soft polymer sheet, for example, may comprise a partially cured polyimide that is easily press fit over the upper portion of the balls. Pressing the polymer sheet against the balls seals the bottom portion of each of the balls from the upper portion. Creating this seal is important in subsequent processing steps. As will be explained in more detail shortly, the layer of material provides a solder-tight seal against each of the socketable members (e.g., balls 10).

Another alternative is to apply a "uncured" polymer such as a viscous polyimide over the top surface of the balls, and then cure it in a conventional manner. Once cured, the array of balls 10 are trapped in a solid matrix of material.

It should also be understood that materials other than polyimide or ordinary polymers could be utilized as the layer of material 13 shown in FIG. 1B. The key requirement of the layer of material is to provide a solder-tight seal against each of the socketable members. That is to say, the layer of material creates a physical dam that prevents solder from flowing or wicking to the bottom portion of the ball during subsequent processing steps. The material is simply required to possess the characteristics of dimensional stability, ability to withstand soldering temperatures, ability to be sized appropriately, and the ability to provide a solder-tight seal around each of the socketable members.

Figure 1C:
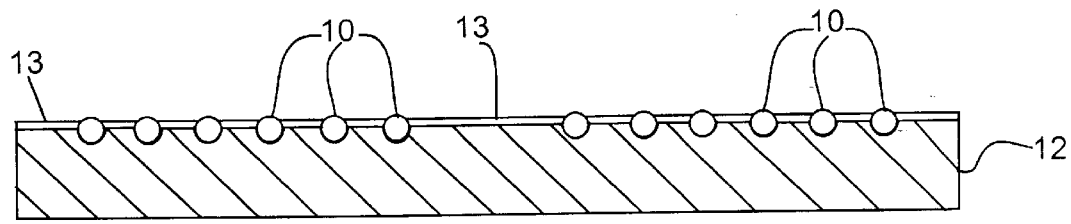

FIG. 1C illustrates the next step in the method according to one embodiment of the present invention. Here, the layer of material 13 is thinned so that a top area of each of the balls 10 is exposed. This step may be performed in a variety of ways. For example, in the case where the layer of material 13 comprises an polyimide, known mechanical or chemical etching processes may be utilized to expose a top area of each of the balls 10.

Figure 1D:
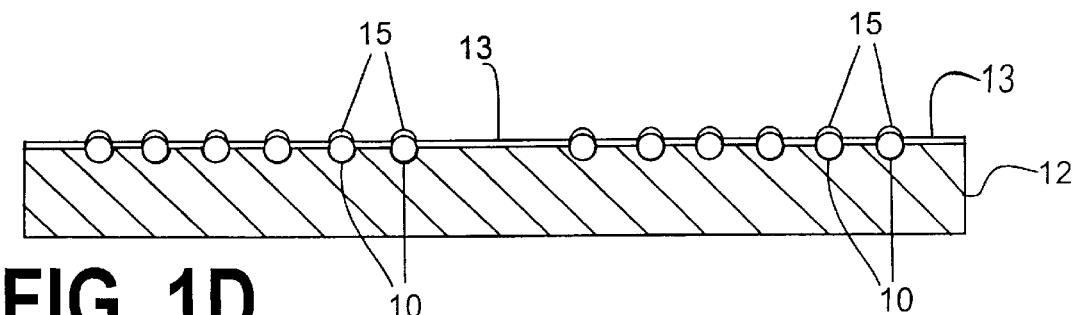

It is worth mentioning that there are no strict requirements regarding the thickness of layer 13 shown in FIG. 1C. Generally, the material is cast around the balls to a depth of approximately one-fourth the diameter of the balls. The removal or etching step exposes the top area of the ball for subsequent processing. In the case where each of the balls comprises a metal core, the exposed core is coated with solder, as shown in FIG. 1D. This process step may be accomplished employing ordinary stencil printing methods, screen printing, or other common plating methods.

FIG. 1D shows the solder coating 15 covering only the top area of each of balls 10. As explained previously, layer 13 provides a solder-tight seal against balls 10 so as to prevent wicking or solder flow to the bottom portion of the each of the balls. In the illustrative example, the bottom portion includes the portion of the ball covered by the polymer layer and also the portion of the ball disposed in recess 11 of tray 12.

Figure 1E:
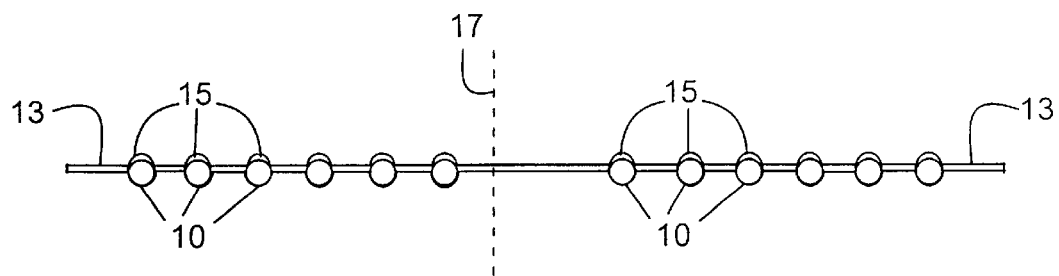
Figure 1F:
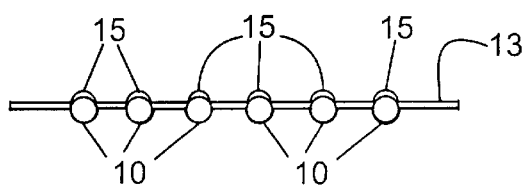

In FIGS. 1E and 1F, the polymer sheet/ball assembly is shown delaminated from tray 12. Individual ball array patterns are then cut from the multiple area array sheet. In FIG. 1E, the cut line is shown as dashed line 17. FIG. 1F depicts a polymer/ball assembly comprising a single array of balls 10 suspended in polymer sheet 13, with a solder coating 15 over the top area of each of the balls 10.

Figure 1G:
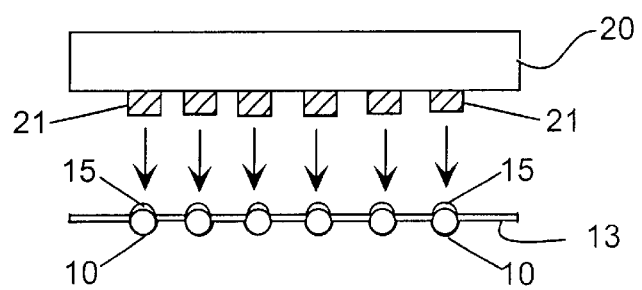

The next step in the process is to align the balls to the land grid array of the package, as illustrated in FIG. 1G. FIG. 1G shows package 20 having a land grid array disposed on one side of the package. The land grid array comprises individual lands or pads 21 arranged in an array pattern that corresponds to the array configuration of balls 10, as formed within the polymer matrix. The solder coating 15 of each of balls 10 is placed against a corresponding pad 21 of package 20 and a permanent electrical connection is established by heating the solder (i.e., reflowing the solder) according to well known practices.

At this point, the layer of material 13 can either be left in place or removed. The decision of whether or not to remove the layer of material 13 may depend upon the type of socket mechanism used. For example, if the socket functions to grasp the side of the balls, it may be necessary to remove the polymer material. On the other hand, if the balls are simply press-fit against a corresponding socket, then layer 13 may be left in place.

Figure 1H:
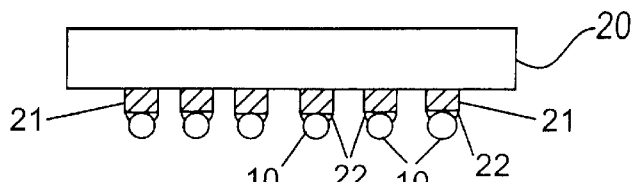

FIG. 1H shows the completed BGA package following the bonding step with layer 13 removed. As can be seen, the BGA package comprises balls 10 in which the reflowed solder 22 provides permanent electrical connection between balls 10 and pads 21 of package 20. Except for the top area of the balls where the solder connection is made, the remaining surface of balls 10 are solder-free. That is, the bottom portion of balls 10 have a gold surface that provides a reliable, superior electrical contact for repeated removable connection to a circuit board. In contrast to the standard solder balls of a BGA package, the package of FIG. 1H provides a removable electrical connection that can be used for production in devices which demand long-term reliability. Practitioners in the art will further appreciate that the invention may be produced inexpensively due to the relative low cost of the copper balls and the simplicity of orienting the balls during the mounting process.

Figure 2A:
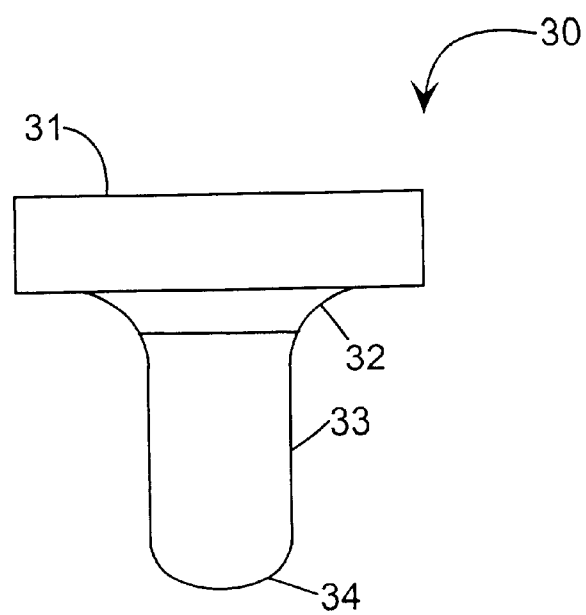
FIGS. 2A–2B show a socketable pin utilized in accordance with one embodiment of the method of the present invention.
Figure 2B:
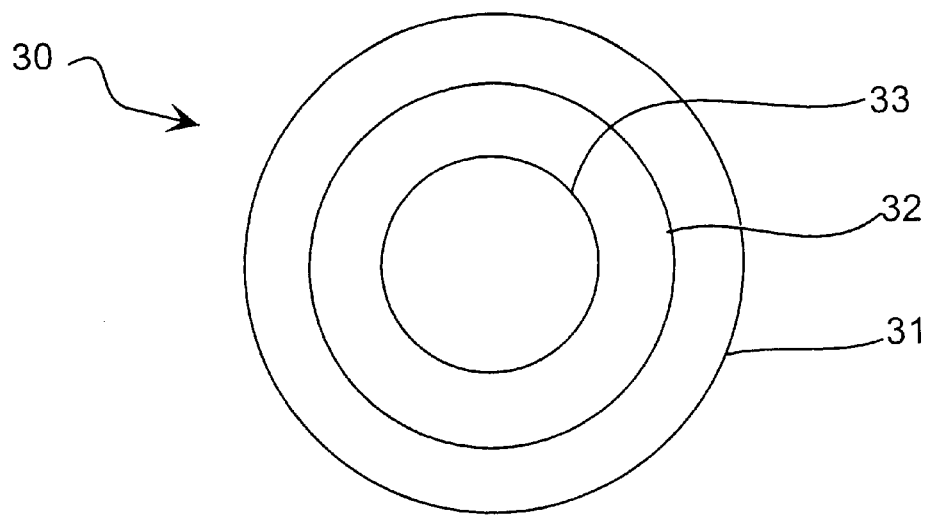

It should be appreciated that the shape of the socketable members is not crucial to the present invention. Although the examples of FIGS. 1A–1H show the use of spherical members, they could just as well be rectilinear or pin-shaped. In this respect, FIGS. 2A and 2B illustrate a socketable member shaped in the form of a pin 30. FIG. 2A is a side view of pin 30, which includes a head 31, attached to a cylindrical body 33. Between head 31 and body 33 is a beveled transitional area 32. As can be readily seen, the width of head 31 extends beyond the diameter of body 33. This is more apparent in the top view of FIG. 2B, which also shows both head 31 and body 33 being cylindrically shaped. One end of cylindrical body 33 is attached to head 31. The opposite or distal end of body 33 includes a rounded tip 34. The full radius on tip 34 of pin 30 is useful to force open contacts in the socket attached to a circuit board. Practitioners will also appreciate that the wider head 31 provides a large area for soldering in addition to low contact resistance and ease of assembly.

In the described embodiment, pin 30 is approximately 1 millimeter long and comprises a brass core with a nickel/gold-plated surface. The gold surface provides a reliable electrical connection when the pin is placed into the socket that grabs or otherwise exerts a contact force against the pin.

Figure 3A:
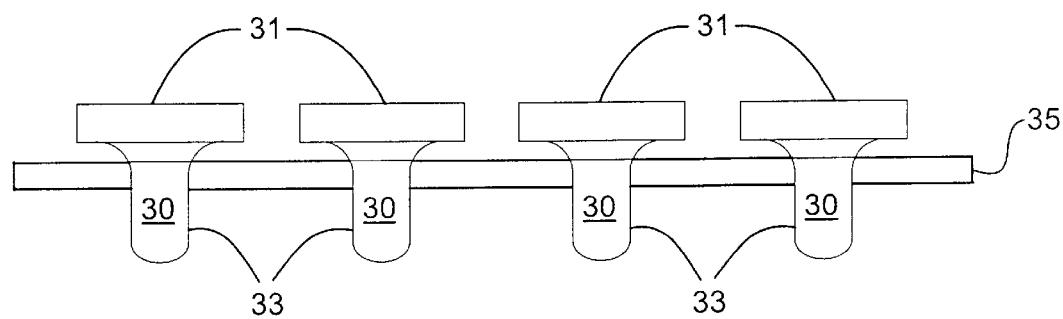
FIGS. 3A–3B illustrate use of the socketable pin shown in FIGS. 2A–2B in another embodiment of the method of the present invention.
Figure 3B:
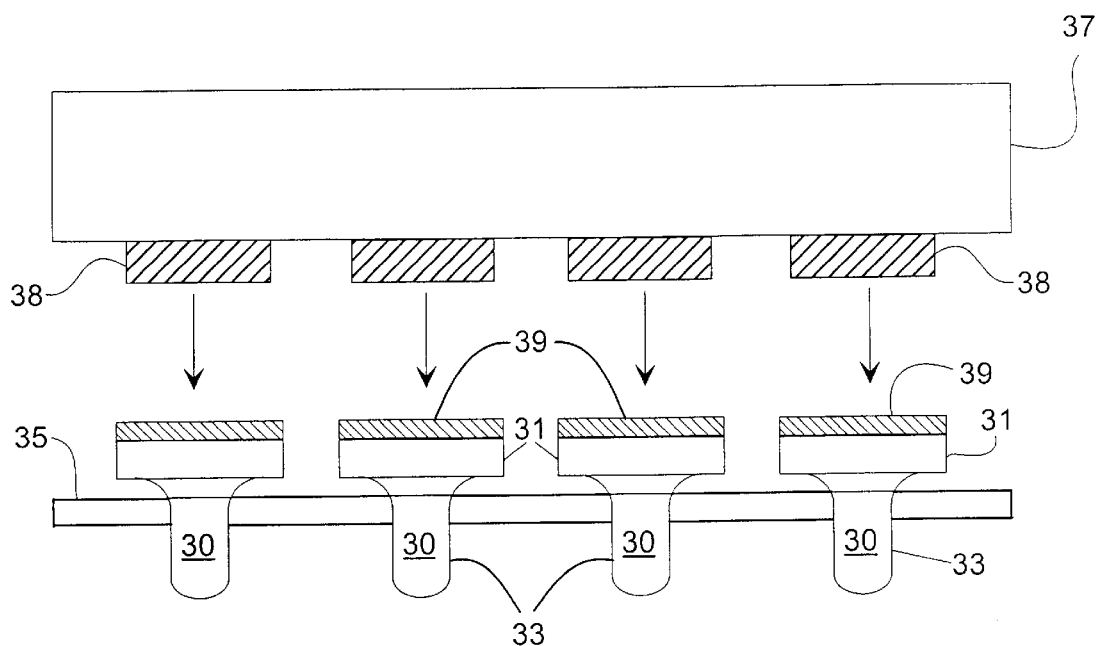

FIGS. 3A and 3B illustrate steps in a process for mounting pins 30 to a BGA package 37. In general, the process of FIGS. 3A–3B is similar to the method previously described in connection with FIGS. 1A–1H. The main difference has to do with how the socketable members are located in the layer of material. In FIGS. 3A–3B individual pins 30 are pushed through a polymer sheet 35 that has already been formed with holes through it. Pins 30 may either be pushed into the holes one at a time or an entire array may be aligned into the holes and press fit into the holes simultaneously. In the case where the holes are punched out of sheet 35, sheet 35 should obviously be thick enough to withstand the hole-punching process.

FIG. 3A is a cross-sectional side view of an individual array pattern with pins 30 located in the holes of polymer sheet 35. It is to be noted that the heads 31 of each of pins 30 protrudes above an upper planar surface of sheet 35 with the cylindrical body 33 of the pins extending through the holes of the sheet. The purpose of the polymer sheet 35 is the same as described in connection with the method of FIGS. 1A–1H. In other words, pushing pins 30 into individual holes creates a solder-tight seal that prevents wicking or penetration of solder along the cylindrical body 33 of pins 30.

Whereas the previously described embodiment relies upon a bond between the ball and polymer layer to seal the solder, in the embodiment of FIGS. 3A–3B, the seal is mechanical in nature. Both methods, however, achieve the same purpose. In this respect, an alternative process is to coat pins 30 with a soft polymer while the pins are held in the array configuration by a tray or some other equivalent means. Heating or curing of the polymer would then create a bond along the cylindrical body 33 of pins 30 in the same manner as described in conjunction with FIGS 1A–1H. After the polymer has been cured, a chemical etch may being utilized to expose each of the heads of the pins.

In either case, once the heads of each of the pins have been sealed from the body of the pin, solder is applied to a top surface of each of the heads 31. FIG. 3B depicts a solder coating 39 covering the top area of each of heads 31. A corresponding array of pads of package 37 is then placed against the solder coating followed by an ordinary heating step, which creates a permanent electrical connection between heads 31 and corresponding pads 38. During this solder reflow step the polymer sheet 35 prevents solder from wicking down along the cylindrical body 33 of pins 30.

After the pins have been permanently bonded to the pads of the package, the polymer sheet 35 may either be left in place or removed as previously discussed.

Figure 4A:
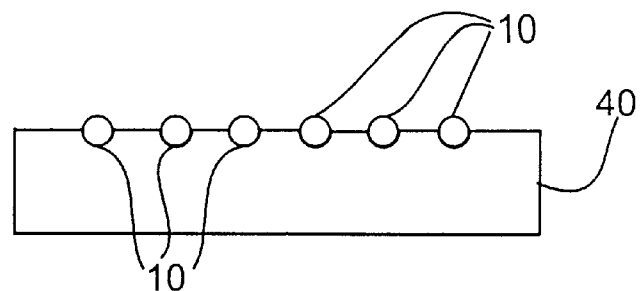
FIGS. 4A–4C illustrate yet another embodiment of the method of the present invention.
Figure 4B:
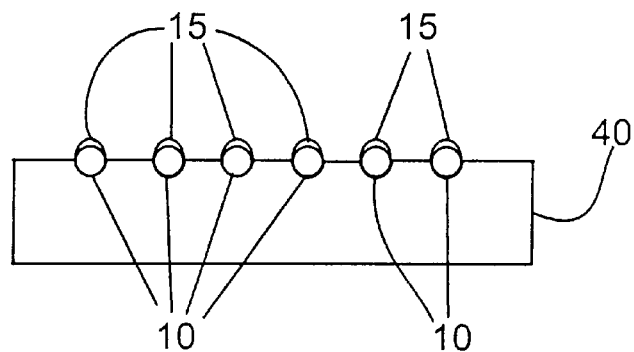
Figure 4C:
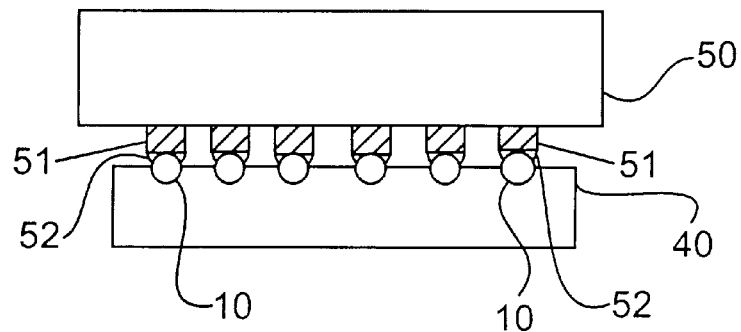

FIGS. 4A–4C illustrate yet another alternative method of producing a socketable package in accordance with the present invention. Instead of placing balls 10 into a tray or tooled metal plate—and then applying a layer of polymer to the top portion of the balls—FIG. 4A shows balls 10 being located in a block of material 40. As before, material 40 may comprise a polymer such as polyimide or other material which has characteristics of dimensional stability, ability to withstand soldering temperatures, appropriate sizing capability, and a solder-tight seal around each of balls 10. The block of material 40 is formed to include recesses or pockets arranged in the desired array configuration.

Once located within block 40 with the exposed portion of balls 10 extending above a planar surface of the block, a solder coating 15 is applied to the exposed portion of balls 10. This coating step is shown in FIG. 4B.

Next, pads 51 of the corresponding land grid array of package 50 are placed in contact with the solder coating 15 of balls 10. The solder is then reflowed to establish a permanent electrical connection between balls 10 and pads 51 of package 50.

FIG. 4C shows the reflowed solder 52 providing a permanent electrical connection between balls 10 and pads 51. At this point in the process, block 10 may be removed or etched back to expose the gold plated bottom surface for connection to corresponding socket members arranged on a printed circuit board.

It should be understood that although the present invention has been described in conjunction with specific embodiments, numerous modifications and alterations could be made without departing from the scope of the present invention. For example, although hard metallic balls have been described for use as socketable members in the above description, softer, more flexible balls having a metallic coating may also be utilized. In addition, solder paste or flux may be applied to the pads of the grid array pattern on the packages to facilitate bonding of the balls, pins, or other type of socketable member. Plating materials other than nickel/gold may also be utilized for providing a reliable electrical connection. Accordingly, the specification and drawings are to be regarded in an illustrative rather than a restrictive sense.

We claim:

1. A method for mounting socketable members to a package having an array of pads comprising the steps of:
   (a) placing the socketable members into pockets or holes of a tray, the pockets or trays being sized such that each of the socketable members has an upper portion that protrudes above a planar surface of the tray;
   (b) applying a layer of material over the socketable members and the planar surface of the tray, the layer of material providing a seal against the upper portion of each of the socketable members;

(c) exposing a top area of the upper portion of each of the socketable members;

(d) coating the top area of each socketable member with solder; and (e) bonding the top area of each socketable member to a corresponding pad of the package to establish electrical contact therebetween.

2. The method according to claim 1 wherein the pockets or holes are arranged in a pattern that corresponds to the array of pads disposed on the package.

3. The method according to claim 1 wherein the layer of material comprises a polymer.

4. The method according to claim 3 wherein the polymer comprises polyimide.

5. The method according to claim 1 wherein step (c) comprises the step of:

removing a film of the layer of material to expose the top area of the upper portion of each of the socketable members.

6. The method according to claim 5 wherein the removing step comprises chemically etching the layer of material.

7. The method according to claim 5 wherein the removing step comprises mechanically abrading the layer of material.

8. A method according to claim 1 further comprising the step, after step (d), of:

removing the socketable members from the tray.

9. The method according to claim 1 wherein step (e) comprises the steps of:

placing the top area of each socketable member against the corresponding pad of the package; and reflowing the solder to establish electrical contact between the socketable member and the corresponding pad.

10. The method according to claim 1 wherein the socketable members comprise a conductive metal.

11. The method according to claim 10 wherein the socketable members comprise balls.

12. The method according to claim 11 wherein the balls comprise a copper core and a nickel/gold plated surface.

13. The method according to claim 10 wherein the socketable members comprise pins.

14. The method according to claim 13 wherein the pins include a head attached to a cylindrical body.

15. The method according to claim 10 wherein the conductive metal comprises gold.

16. A method for mounting a plurality of socketable pins to a package having a plurality of pads, each pin having a head and a body, the method comprising the steps of:

(a) press-fitting the body of each of the socketable pins into an opening of a polymer layer such that the head extends above a top surface of the polymer layer;

(b) coating a primary surface of the head of each socketable pin with solder; and (c) bonding the primary surface of the head of each socketable pin to a corresponding pad of the package to establish electrical contact therebetween.

17. The method according to claim 16 wherein the socketable pins are arranged in an array pattern in the polymer layer that corresponds to the plurality of pads disposed on the package.

18. The method of claims 16 wherein each pin includes a rounded tip located at a distal end of the body, the rounded tip of each of the socketable pins protruding beyond a bottom surface of the polymer layer when each of the socketable pins is inserted into the opening.

19. The method of claim 16 wherein the polymer layer keeps the distal end of the body of each pin free of solder during step (b).

20. A method according to claim 16 wherein step (c) comprises the steps of replacing the head of each socketable pin against the corresponding pad of the package; and reflowing the solder to establish electrical contact between the head of each socketable pin and the corresponding pad of the package.

21. The method according to claim 16 wherein the socketable pins comprise a conductive metal.

22. The method according to claim 21 wherein the conductive metal comprises gold.

23. The method according to claim 21 wherein the conductive metal comprises a brass core and a nickel/gold plated surface.

24. A method according to claim 16 wherein the body of each pin is cylindrically shaped.

25. The method according to claim 24 wherein the head of each pin has a width that is larger than the diameter of the cylindrically shaped body.

26. The method according to claim 25 wherein the head is cylindrically shaped.

27. A method for mounting socketable members to an integrated circuit (I/C) package comprising the steps of:

(a) locating the socketable members in a block such that an upper surface area of each socketable member is exposed above a planar surface of the block;

(b) coating the upper surface area with solder; and (c) bonding the upper surface area of each socketable member to a corresponding pad of the I/C package to establish electrical contact therebetween.

* * * * *